United States Patent
May et al.

(10) Patent No.: US 10,699,995 B2
(45) Date of Patent: Jun. 30, 2020

(54) ISOLATOR WITH SYMMETRIC MULTI-CHANNEL LAYOUT

(71) Applicant: Silicon Laboratories Inc., Austin, TX (US)

(72) Inventors: Michael R. May, Austin, TX (US); Charles Guo Lin, Austin, TX (US); Carlos Briseno-Vidrios, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 7 days.

(21) Appl. No.: 15/974,857

(22) Filed: May 9, 2018

(65) Prior Publication Data
US 2019/0348355 A1 Nov. 14, 2019

(51) Int. Cl.
*H01L 23/498* (2006.01)
*H01L 23/00* (2006.01)
*H01L 23/64* (2006.01)

(52) U.S. Cl.
CPC ...... *H01L 23/49838* (2013.01); *H01L 23/642* (2013.01); *H01L 24/47* (2013.01)

(58) Field of Classification Search
CPC .......... H01L 24/49; H01L 2224/48247; H01L 24/06; H01L 23/49838; H01L 24/48; H01L 2224/48137; H01L 23/66; H01L 23/642; H01L 21/76; H01L 2224/04042; H01L 23/49; H01L 23/49575; H01L 24/47
See application file for complete search history.

(56) References Cited

U.S. PATENT DOCUMENTS

| 9,812,989 | B1 | 11/2017 | Dupuis |
| 2006/0220778 | A1 | 10/2006 | Marques |
| 2018/0278229 | A1* | 9/2018 | Sankaran ................. H03H 7/03 |

OTHER PUBLICATIONS

U.S. Appl. No. 15/398,241, filed Jan. 4, 2017, entitled "Physical Design in Magnetic Environment," by inventors Aaron J. Caffee and Brian G. Drost.

* cited by examiner

*Primary Examiner* — Jasmine J Clark
(74) *Attorney, Agent, or Firm* — Zagorin Cave LLP

(57) ABSTRACT

An integrated circuit isolation product includes a first integrated circuit die. The first integrated circuit die includes a first terminal and a second terminal adjacent to the first terminal. The first terminal and the second terminal are configured as a differential pair of terminals configured to communicate a differential signal across an isolation barrier. The first integrated circuit die includes at least one additional terminal adjacent to the differential pair of terminals. The at least one additional terminal is disposed symmetrically with respect to the differential pair of terminals. The first terminal may have a first parasitic capacitance and the second terminal may have a second parasitic capacitance. The first parasitic capacitance may be substantially the same as the second parasitic capacitance. The at least one additional terminal may be disposed symmetrically with respect to a line of symmetry for the differential pair of terminals.

20 Claims, 7 Drawing Sheets

ISOLATOR WITH SYMMETRIC MULTI-CHANNEL LAYOUT

BACKGROUND

Field of the Invention

The invention relates to isolation technology and more particularly to a communications channel across an isolation barrier.

Description of the Related Art

In a typical control application, a processor system provides one or more control signals to a load system. During normal operation, a large DC or transient voltage difference may exist between the power domain of the processor system and the power domain of the load system, thus requiring an isolation barrier between the processor system and the load system. For example, one domain may be grounded at a voltage that is switching with respect to earth ground by hundreds or thousands of volts. In other applications, when the expected voltage difference between the power domains is small in normal operation, an isolation barrier increases safety. Accordingly, an intermediate system includes isolation that prevents damaging currents from flowing between the processor system and the load system. Although the isolation prevents the processor system from being coupled to the load by a direct conduction path, an isolation communications channel allows communication between the two systems using optical (opto-isolators), capacitive, inductive (transformers), or electromagnetic techniques. However, such communication is susceptible to common mode transients that can interfere with the accuracy of the information transmitted across the isolation communications channel. Thus, isolation technology with immunity to common mode transients is desirable.

SUMMARY OF EMBODIMENTS OF THE INVENTION

In at least one embodiment of the invention, an integrated circuit isolation product includes a first integrated circuit die. The first integrated circuit die includes a first terminal and a second terminal adjacent to the first terminal. The first terminal and the second terminal are configured as a differential pair of terminals configured to communicate a differential signal across an isolation barrier. The first integrated circuit die includes at least one additional terminal adjacent to the differential pair of terminals. The at least one additional terminal is disposed symmetrically with respect to the differential pair of terminals. The first terminal may have a first parasitic capacitance and the second terminal may have a second parasitic capacitance. The first parasitic capacitance may be substantially the same as the second parasitic capacitance. The at least one additional terminal may be disposed symmetrically with respect to a line of symmetry for the differential pair of terminals. The line of symmetry may extend through a midpoint of the first terminal and the second terminal. The at least one additional terminal may include a third terminal adjacent to the first terminal and a fourth terminal adjacent to the second terminal. The fourth terminal may be a physical copy of the third terminal. The second terminal may be disposed between the first terminal and the fourth terminal. The first terminal may be disposed between the second terminal and the third terminal. The third terminal may be a dummy terminal and the fourth terminal may be a functional terminal.

In at least one embodiment of the invention, a method of manufacturing an integrated circuit product comprises forming a first terminal of an integrated circuit die. The method includes forming a second terminal adjacent to the first terminal of the integrated circuit die. The first terminal and the second terminal are configured as a differential pair of terminals configured to communicate a differential signal across an isolation barrier. The method includes forming at least one additional terminal adjacent to the differential pair of terminals. The at least one additional terminal is disposed symmetrically with respect to the differential pair of terminals. The first terminal may have a first parasitic capacitance and the second terminal may have a second parasitic capacitance. The first parasitic capacitance may be substantially the same as the second parasitic capacitance. The first parasitic capacitance may be within 1% of the second parasitic capacitance. The at least one additional terminal may be disposed symmetrically with respect to a line of symmetry for the differential pair of terminals. The line of symmetry may extend through a midpoint of the first terminal and the second terminal. The first terminal, the second terminal, and the at least one additional terminal may be disposed proximate to a first edge of the integrated circuit die. The method may further include forming a plurality of other terminals disposed proximate to a second edge of the integrated circuit die, the second edge opposing the first edge. The line of symmetry may partition the plurality of other terminals into a first set of terminals and a second set of terminals. The second set of terminals may be a mirror image about the line of symmetry of the first set of terminals.

In at least one embodiment of the invention, an isolator includes a first die coupled to a first voltage domain. The first die includes a first terminal and a second terminal adjacent to the first terminal. The first terminal and the second terminal form a differential pair of terminals configured to communicate a differential signal across an isolation barrier. The isolator includes a third terminal adjacent to the first terminal and includes a fourth terminal adjacent to the second terminal. The second terminal is disposed between the first terminal and the fourth terminal. The first terminal is disposed between the second terminal and the third terminal. The fourth terminal is a physical copy of the third terminal. A first parasitic capacitance of the first terminal is substantially the same as a second parasitic capacitance of the second terminal. The isolator includes a second die coupled to a second voltage domain. The second die is electrically isolated from and communicatively coupled to the first die. The second die includes a fifth terminal and a sixth terminal adjacent to the fifth terminal. The fifth terminal and the sixth terminal form a second differential pair of terminals configured to communicate the differential signal across the isolation barrier. The isolator includes a seventh terminal adjacent to the fifth terminal and an eighth terminal adjacent to the sixth terminal. The sixth terminal is disposed between the fifth terminal and the eighth terminal. The fifth terminal is disposed between the sixth terminal and the seventh terminal. The eighth terminal is a physical copy of the seventh terminal and a third parasitic capacitance of the fifth terminal is substantially the same as a fourth parasitic capacitance of the sixth terminal. A line of symmetry may extend through a midpoint of the first terminal and the second terminal and through a second midpoint of the fifth terminal and the sixth terminal. The first integrated circuit die may include a plurality of additional terminals. The line of symmetry may partition the plurality of additional terminals into a first set of terminals and a second set of terminals. The second set of terminals may be a mirror image about the line of symmetry of the first set of terminals.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 1:
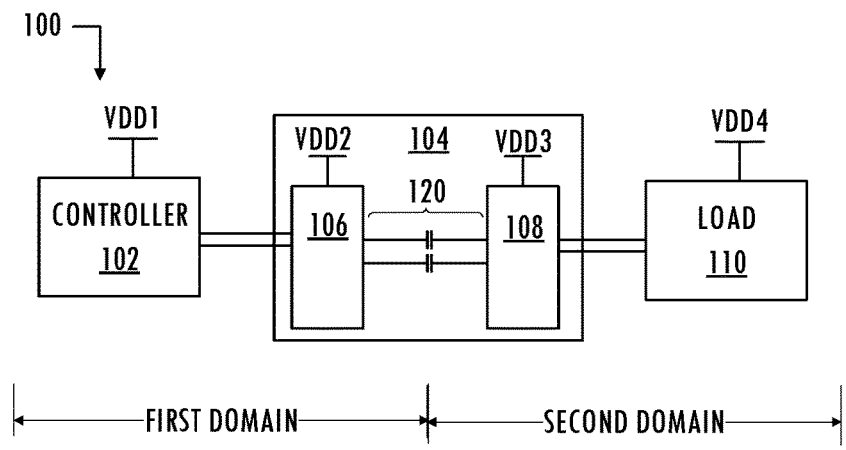
FIG. 1 illustrates an exemplary system including an isolator.
Figure 2:
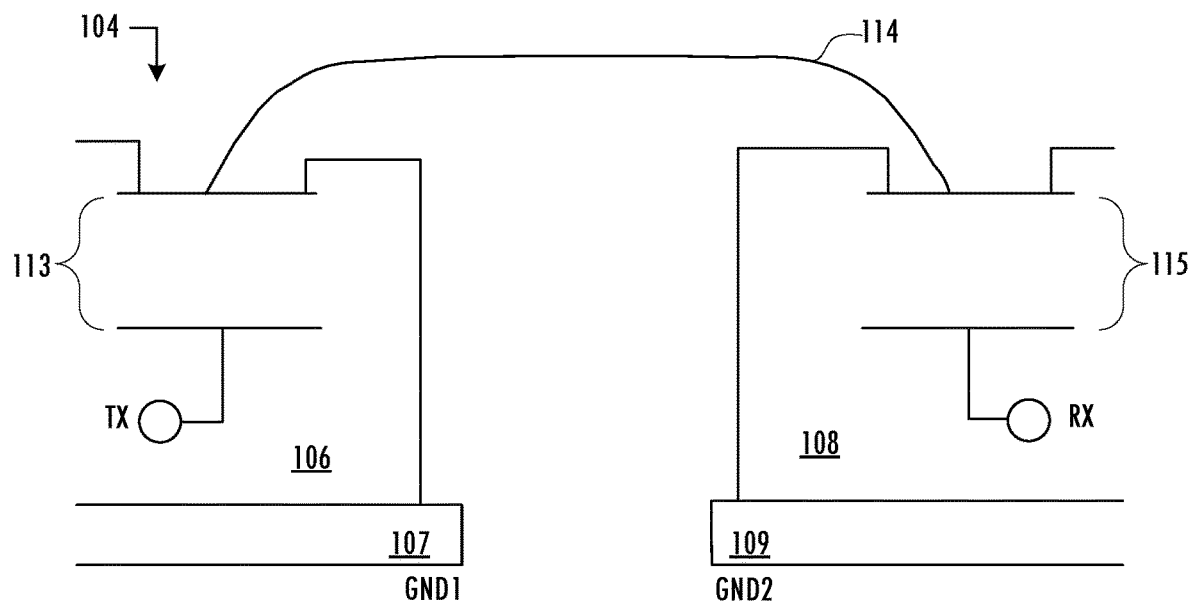
FIG. 2 illustrates a cross-sectional view of an exemplary system including an isolator.

Referring to FIGS. 1 and 2, in an exemplary application, controller 102, which may be a microprocessor, microcontroller, or other suitable processing device, operates in a first domain (i.e., a voltage domain including VDD1, e.g., 5 Volts (V)) and communicates with a load system operating in a second domain (i.e., a domain including VDD4, e.g., 150V) using isolator 104. Isolator 104 electrically isolates the domains on a first side of system 100, e.g., the first domain including VDD1 (e.g., less than ten volts) and VDD2 (e.g., less than ten volts) and devices coupled thereto, from a second side of system 100, e.g., the secondary domain including VDD3 (e.g., tens of volts) and VDD4 (e.g., hundreds of volts) and devices coupled thereto.

Isolation communications channel 120 facilitates safe communication of a signal received from controller 102 in the first domain across an isolation barrier to load 110 of the second domain. The second domain includes driver circuitry (e.g., included in integrated circuit die 108), which generates an output control signal based on the signal received from the first domain and provides a suitable drive signal to load 110. In an exemplary embodiment of isolator 104, integrated circuit die 106 is attached to lead frame 107 and integrated circuit die 108 is attached to lead frame 109. Each integrated circuit die includes integrated circuit terminals coupled to isolation communications channel 120 and are packaged as a single device. In general, an integrated circuit terminal (e.g., a contact pad or bond pad) is formed from one or more conductors (e.g., gold, silver, copper, aluminum, polysilicon, or combination thereof) on an insulating layer that includes conductive vias that electrically couple the integrated circuit terminal to circuitry on the integrated circuit die below the insulating layer. Isolation communications channel 120 allows safe communication of signals from controller 102 to load 110 via integrated circuit die 106 and integrated circuit die 108. Similarly, isolator 104 may safely provide at least one feedback signal from load 110 to controller 102 via isolation communications channel 120.

In at least one embodiment of system 100, isolation communications channel 120 blocks DC signals and only passes AC signals. Isolation communications channel 120 is described as including capacitive isolation, although other suitable isolation techniques may be used. Capacitor 113 and capacitor 115 may be integrated with integrated circuit die 106 and integrated circuit die 108, respectively, and coupled to each other via bond wire 114 and bond wire 116. Capacitor 113 and capacitor 115 may each include a bottom plate formed in a first conductive semiconductor layer (e.g., metal-1), a top plate formed in a second conductive semiconductor layer (e.g., metal-7) above the first conductive semiconductor layer, and a dielectric material (e.g., silicon dioxide) formed between the top and bottom plates.

An exemplary isolation communications channel 120 uses digital modulation (e.g., on-off keying modulation) to communicate one or more digital signals between integrated circuit die 106 and integrated circuit die 108, although other communication protocols may be used. In general, on-off keying modulation is a form of amplitude-shift keying modulation that represents digital data as the presence or absence of a carrier wave or oscillating signal having a carrier frequency $f_c$ (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, isolator 104 may communicate other types of signals (e.g., pulse width modulated signals or other types of amplitude shift keying modulated signals) across isolation communications channel 120. The digital modulation scheme used may be determined according to performance specifications (e.g., signal resolution) and environment (e.g., probability of transient events) of the target application.

In at least one embodiment of isolator 104, integrated circuit die 106 receives a digital signal, e.g., asynchronously to an internal clock and generates a modulated representation of the digital signal. A carrier clock signal has a carrier frequency that is much greater than a frequency associated with data of the digital signal. By driving a differential signal representing the data on a capacitively coupled conductor of isolation communications channel 120, integrated circuit die 106 provides integrated circuit die 108 with a representation of the data. Integrated circuit die 108 includes receiver circuitry that may amplify a received differential signal and demodulates the digital differential signal to generate a recovered digital signal, which is a recovered version of the data. In at least one embodiment, integrated circuit die 108 includes a low-noise amplifier coupled in series with signal conditioning circuit and a demodulator. The demodulator includes a rectifier circuit, which generates a full-wave-rectified (FWR) signal and removes the carrier signal to provide a root mean square (RMS) proportional signal, and a comparator, which resolves the RMS output of the rectifier into the recovered digital signal.

Figure 3:
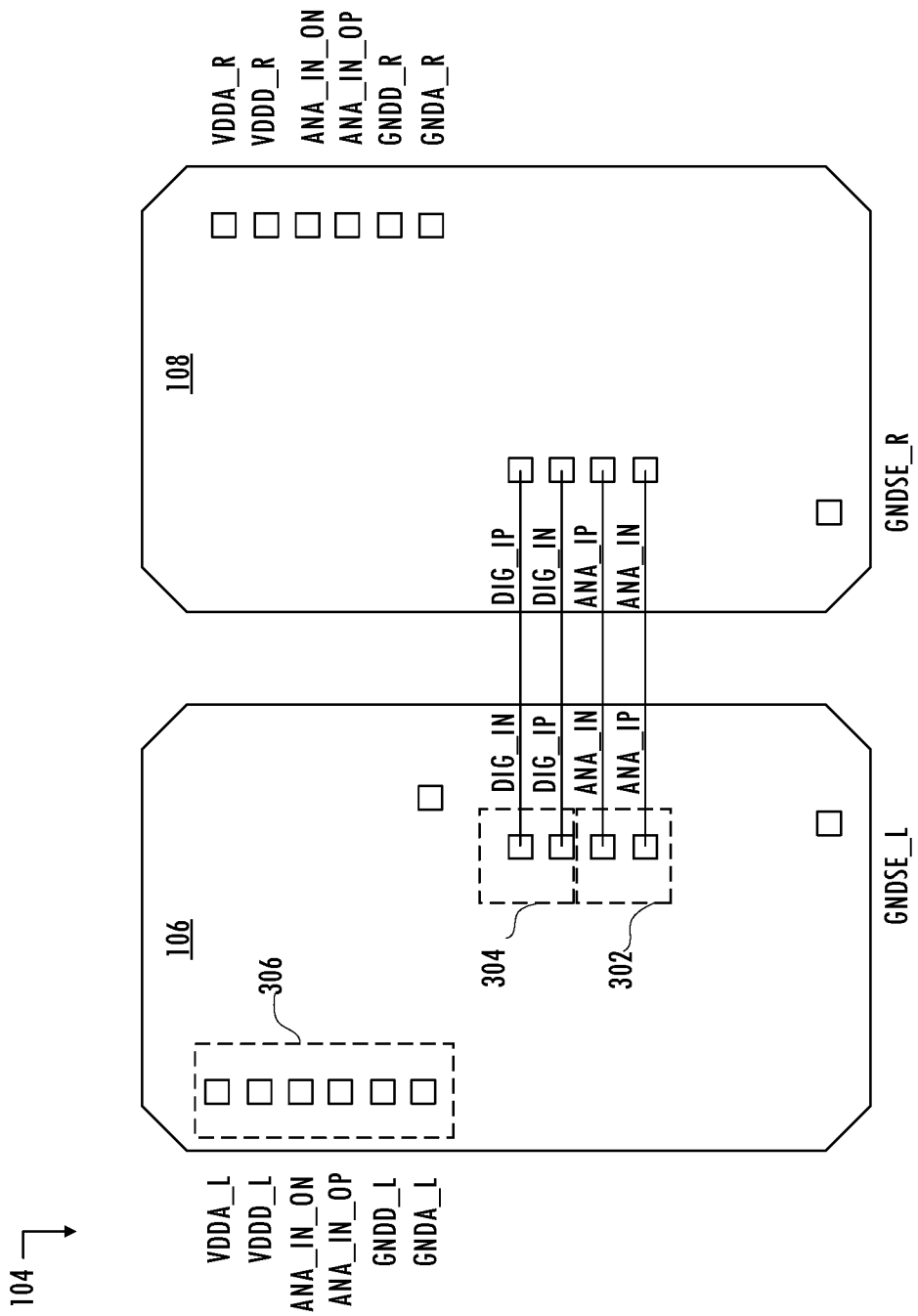
FIG. 3 illustrates a plan view of an exemplary isolator of FIG. 2.
Figure 4A:
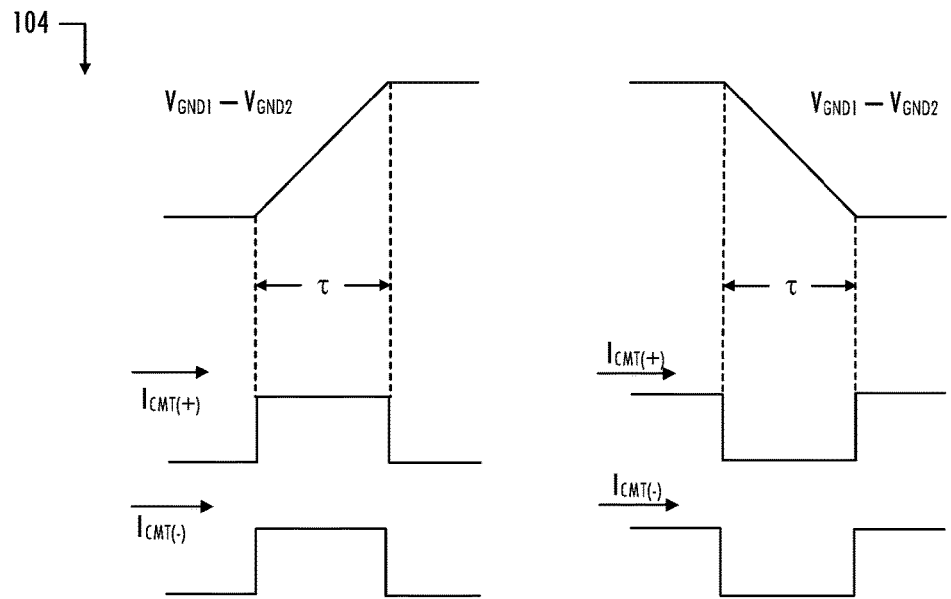
FIG. 4A illustrates voltage domain relationships and exemplary common mode transient events of the integrated circuit system of FIG. 2.
Figure 4B:
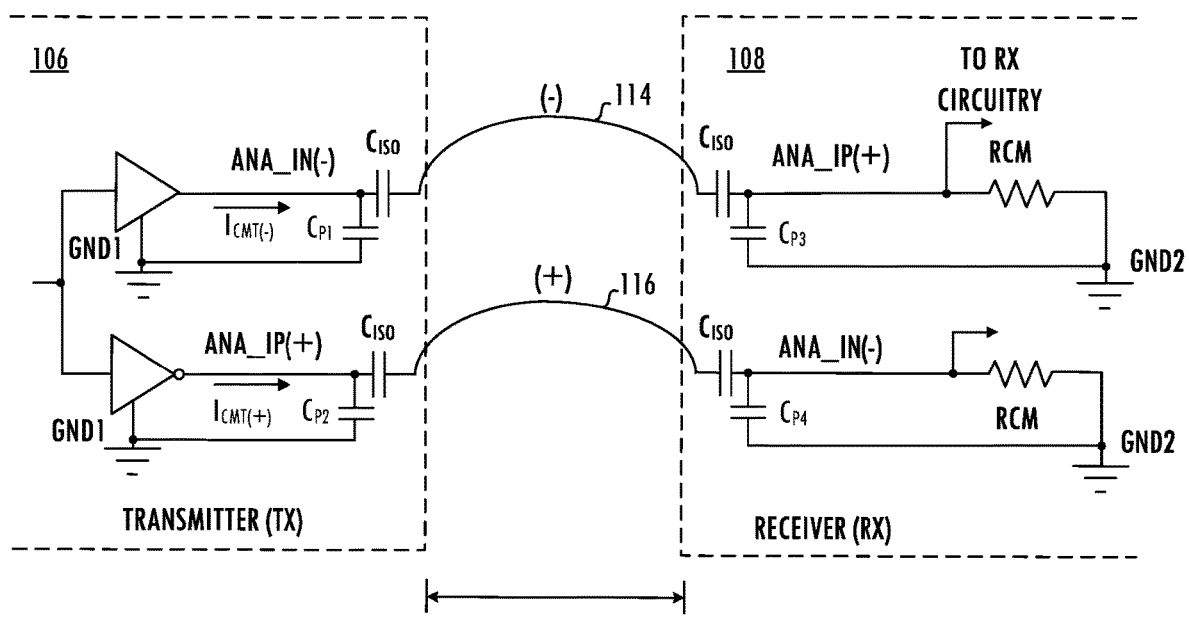
FIG. 4B illustrates a common mode transient current of the isolator of FIG. 2.

Referring to FIGS. 3, 4A, and 4B, isolator 104 transfers information between two ground domains that could be thousands of Volts apart. Further, the ground domains could be moving relative to each other at extremely fast voltage transients of approximately 100 KV/us. A conventional isolator 104 includes multiple differential channels, each including a differential pair of terminals. Differential pair of terminals 304 includes inverting terminal DIG_IN and non-inverting terminal DIG_IP on integrated circuit die 106 coupled by bond wires to corresponding terminals in integrated circuit die 108. Similarly, differential pair of terminals 302 includes inverting terminal ANA_IN and non-inverting terminal ANA_IP on integrated circuit die 106 and are coupled by bond wires to corresponding terminals of integrated circuit die 108.

Transients caused by relative differences between the ground of integrated circuit die 106 (GND1) relative to the second ground of integrated circuit die 108 (GND2) are referred to as common mode transient events. Ideally, circuit components are perfectly matched and the common mode transient current does not cause a differential event between terminals ANA_IN (+) and ANA_IP (−). However, in practice, mismatch of actual circuit elements in the differential path and other factors cause the common mode transient current to generate a differential pulse at the input of integrated circuit die 108.

Mismatch of parasitic capacitance on the inverting terminal and parasitic capacitance on the non-inverting terminal of a differential pair of terminals may result from manufacturing process variations. In addition, the terminal layout of integrated circuit die 106 causes mismatch between parasitic capacitance of non-inverting terminal ANA_IP and parasitic capacitance of inverting terminal ANA_IN of differential pair of terminals 302. Differences in the parasitic capacitance $C_{P1}$ of the noninverting terminal ANA_IP and the parasitic capacitance $C_{P2}$ of the inverting terminal ANA_IN limit the common mode transient immunity of isolator 104 because a non-negligible parasitic capacitance mismatch causes a non-negligible voltage based on any common mode transient noise signal to be supplied concurrently to both the inverting terminal and the non-inverting terminal of a differential pair of terminals. Similarly, mismatch of parasitic capacitance $C_{P3}$ and parasitic capacitance $C_{P4}$ on the corresponding terminals of the differential pairs of terminals of integrated circuit die 108 limit the ability of isolator 104 to reject fast transient noise signals. A common mode transient event may cause a substantial common mode transient current $I_{CMT}$ to flow through the isolation barrier capacitors $C_{ISO}$, as illustrated by FIGS. 4A and 4B. That differential pulse can corrupt a digital signal recovered by receiver circuitry in integrated circuit die 108. Integrated circuit die that implement techniques to reduce or eliminate such differential pulses and the associated data corruption are considered to have common mode transient immunity.

Forming individual terminals of the differential pair of terminals proximate to one another on the integrated circuit die can reduce the significance of manufacturing process variations. However, assuming identical physical material and geometry of terminals ANA_IN, ANA_IP, DIG_IN and DIG_IP, the layout of these terminals on integrated circuit die 106 contributes to the mismatch of the parasitic capacitances of corresponding differential pairs of terminals. For example, ANA_IN is adjacent to DIG_IP and adjacent to ANA_IP. Therefore, the parasitic capacitance on terminal ANA_IN has substantial contributions from DIG_IP and ANA_IP. In addition, the parasitic capacitance on ANA_IN may have a contribution from DIG_IN that is less substantial than the contribution from terminals directly adjacent to ANA_IN. However, since ANA_IP is adjacent only to ANA_IN, only the parasitic capacitance of terminal ANA_IP has a substantial contribution from ANA_IN. Although ANA_IP may have non-negligible parasitic capacitance contributions from DIG_IP and DIG_IN, those contributions are less significant than those from ANA_IN. As a result, the parasitic capacitance on ANA_IN is different from the parasitic capacitance on ANA_IP. In an isolator manufactured using an exemplary semiconductor manufacturing process, a typical difference is in the range of several femtofarads to several tens of femtofarads.

Figure 5:
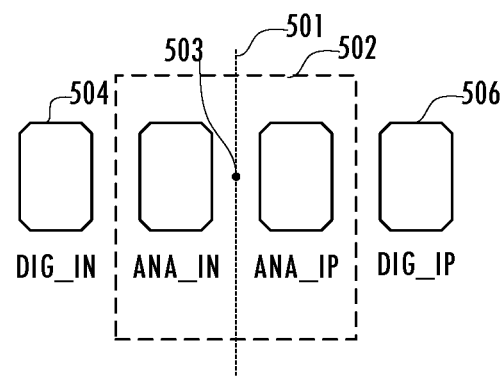
FIG. 5 illustrates an exemplary symmetric layout of two differential pairs of terminals consistent with at least one embodiment of the invention.

Referring to FIG. 5, a symmetric multi-channel layout improves the common-mode transient immunity of isolator 104. The integrated circuit layout positions terminals symmetrically with respect to a predetermined differential pair of terminals (e.g., differential pair of terminals coupled to critical signals). The symmetric layout reduces or eliminates differences between parasitic capacitance of the inverting terminal and parasitic capacitance of the non-inverting terminal of the predetermined differential pair of terminals. In at least one embodiment of isolator 104, the predetermined differential pair of terminals are coupled to analog signals, which tend to be more susceptible to noise and common mode transients than digital signals.

Line of symmetry 501 extends through midpoint 503, which is the midpoint between the inverting terminal and the non-inverting terminal of differential pair of terminals 502. Other terminals in the integrated circuit are arranged about line of symmetry 501 to reduce or eliminate differences in a parasitic capacitance of the inverting terminal and a parasitic capacitance of the non-inverting terminal of differential pair of terminals 502. Arranging other terminals on the integrated circuit die symmetrically with respect to line of symmetry 501 reduces the likelihood that a parasitic capacitance on the individual terminals of differential pair of terminals 502 are different. FIG. 5 illustrates a symmetric layout of terminal 504, terminal 506, and differential pair of terminals 502. Terminal 504 and terminal 506 may form another differential pair of terminals or may be unrelated terminals that are adjacent to differential pair of terminals 502, but are arranged to form a mirror image with respect to line of symmetry 501.

Figure 6:
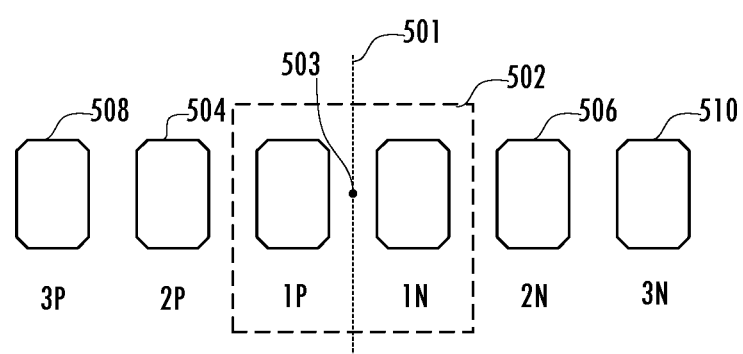
FIG. 6 illustrates an exemplary symmetric layout of a plurality of differential pairs of terminals of an integrated circuit die of an isolator consistent with at least one embodiment of the invention.

FIG. 6 illustrates the symmetric multi-channel layout technique for an integrated circuit with multiple differential pairs of terminals arranged to form two sets of terminals that are mirror images of each other with respect to line of symmetry 501 through midpoint 503 between differential pair of terminals 502. The terminal arrangement of FIG. 6 provides each terminal of differential pair of terminals 502 with substantially the same parasitic capacitance contribution from terminal 504 and terminal 506, which may form a second differential pair of terminals with substantially the same parasitic capacitance contribution from terminal 508 and terminal 510, which may form a third differential pair of terminals. In an exemplary integrated circuit manufacturing process, the terminal arrangement results in the terminals of each differential pair of terminals having parasitic capacitances within 10% of each other and may have parasitic capacitances within 1%. However, a substantial distance between terminal 508 and terminal 510 may increase parasitic capacitance mismatch between those two terminals from process variations across the integrated circuit die. That parasitic capacitance mismatch may be unacceptable in applications in which terminal 508 and terminal 510 form a differential pair of terminals that cannot tolerate a reduction in common mode transient immunity.

Figure 7:
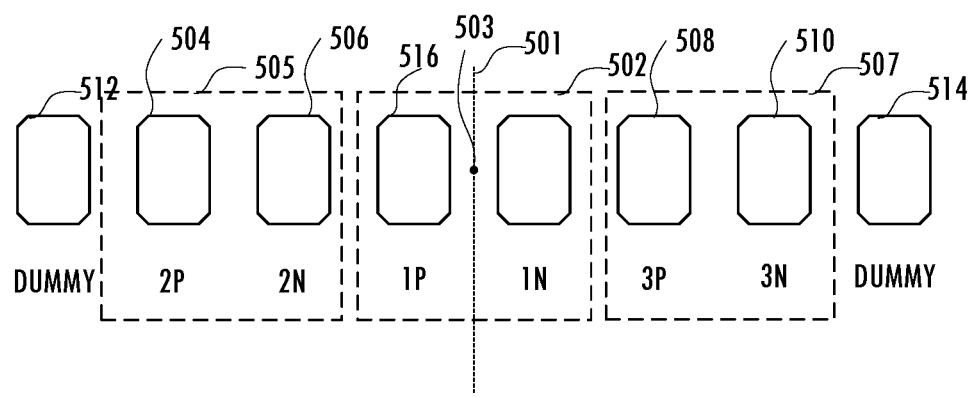
FIG. 7 illustrates an alternate symmetric layout of a plurality of differential pairs of terminals of an integrated circuit die of an isolator consistent with at least one embodiment of the invention.
Figure 8:
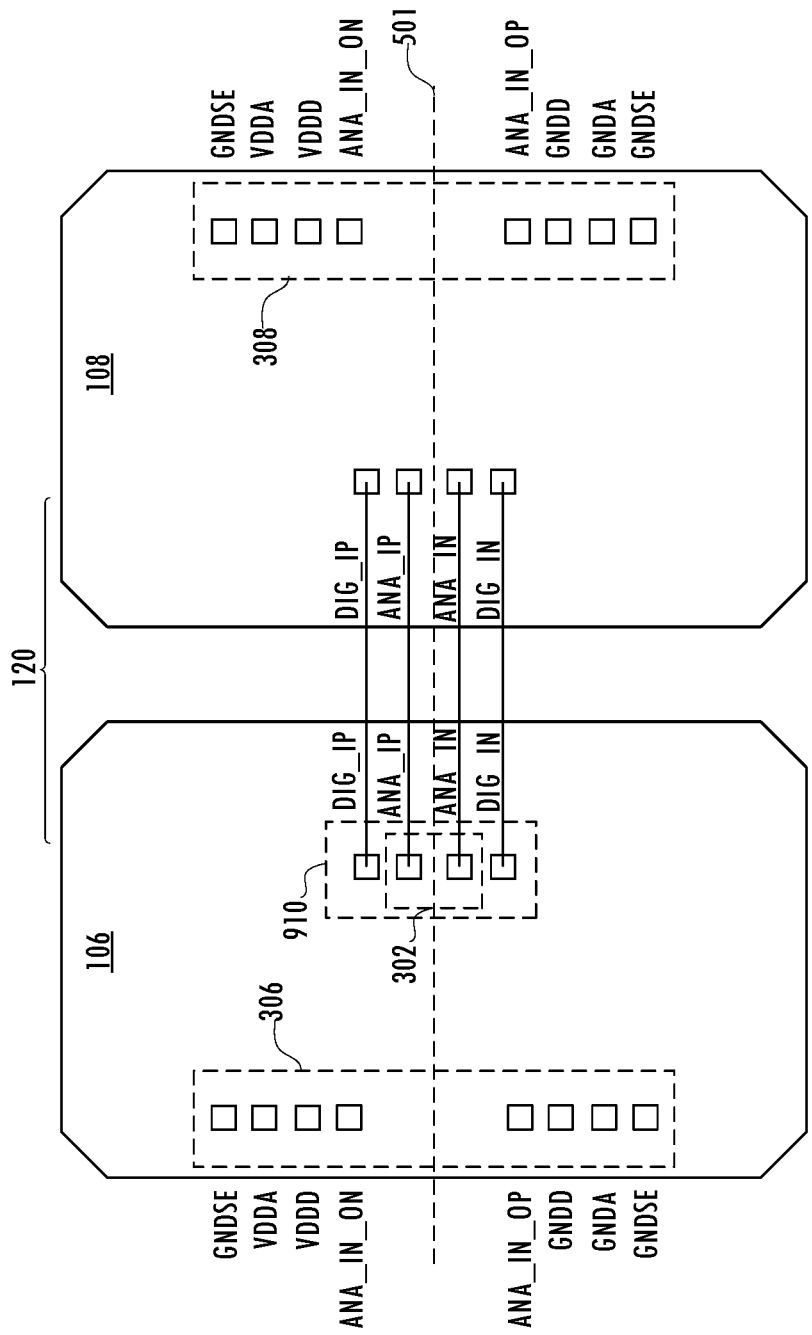
FIG. 8 illustrates a plan view of an exemplary isolator including a symmetric terminal layout consistent with at least one embodiment of the invention.
Figure 9:
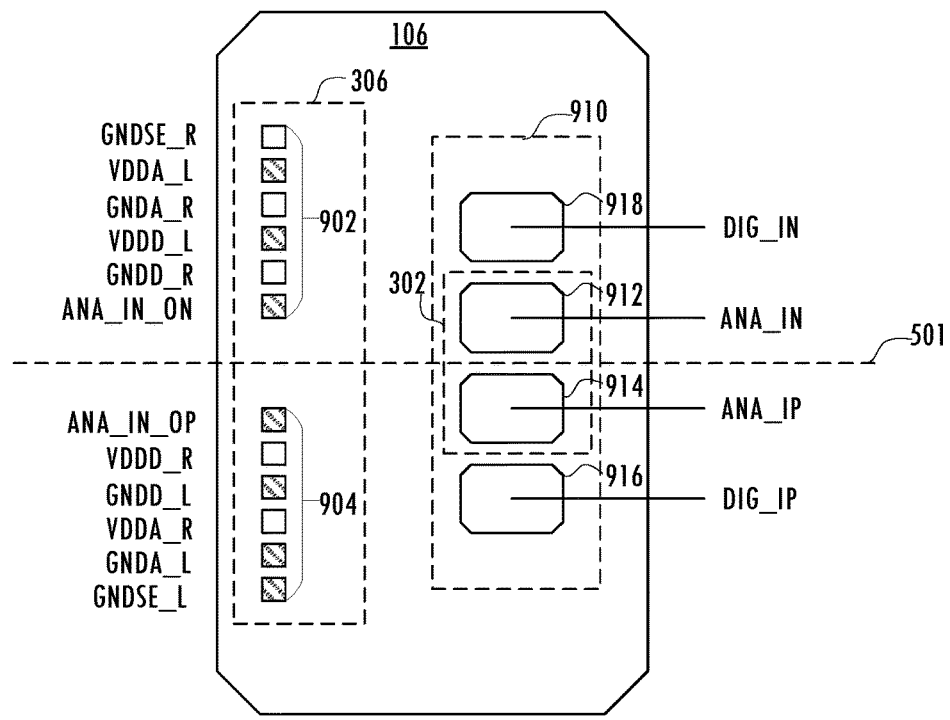
FIG. 9 illustrates a plan view of an exemplary integrated circuit die with symmetric terminal layout configured to operate in a first mode consistent with at least one embodiment of the invention.
Figure 10:
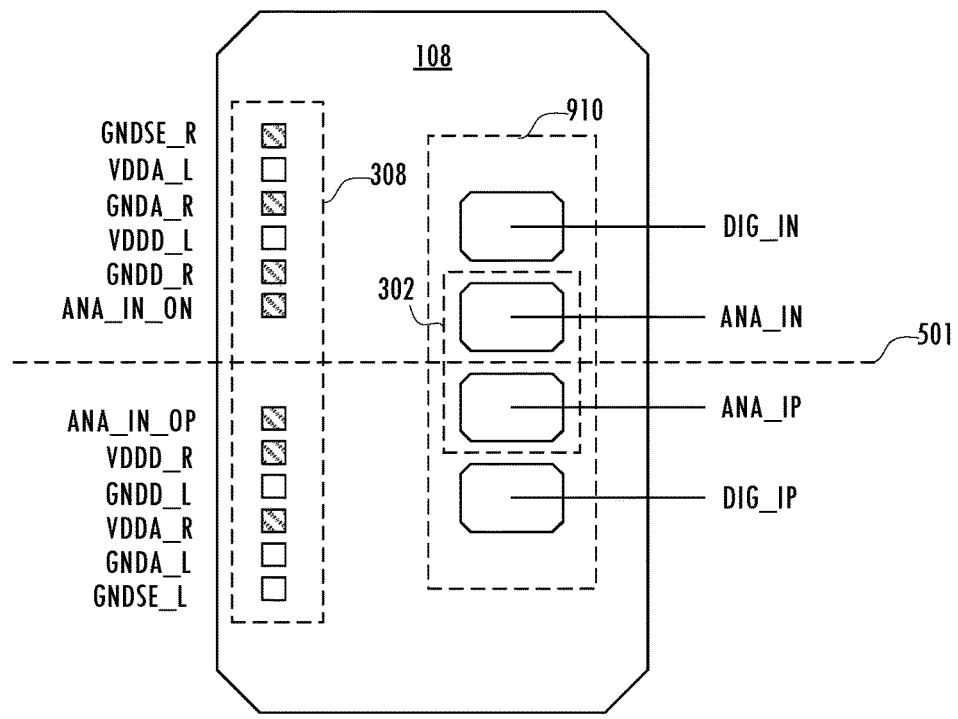
FIG. 10 illustrates a plan view of an exemplary integrated circuit die with symmetric terminal layout configured to operate in a second mode consistent with at least one embodiment of the invention.
Figure 11:
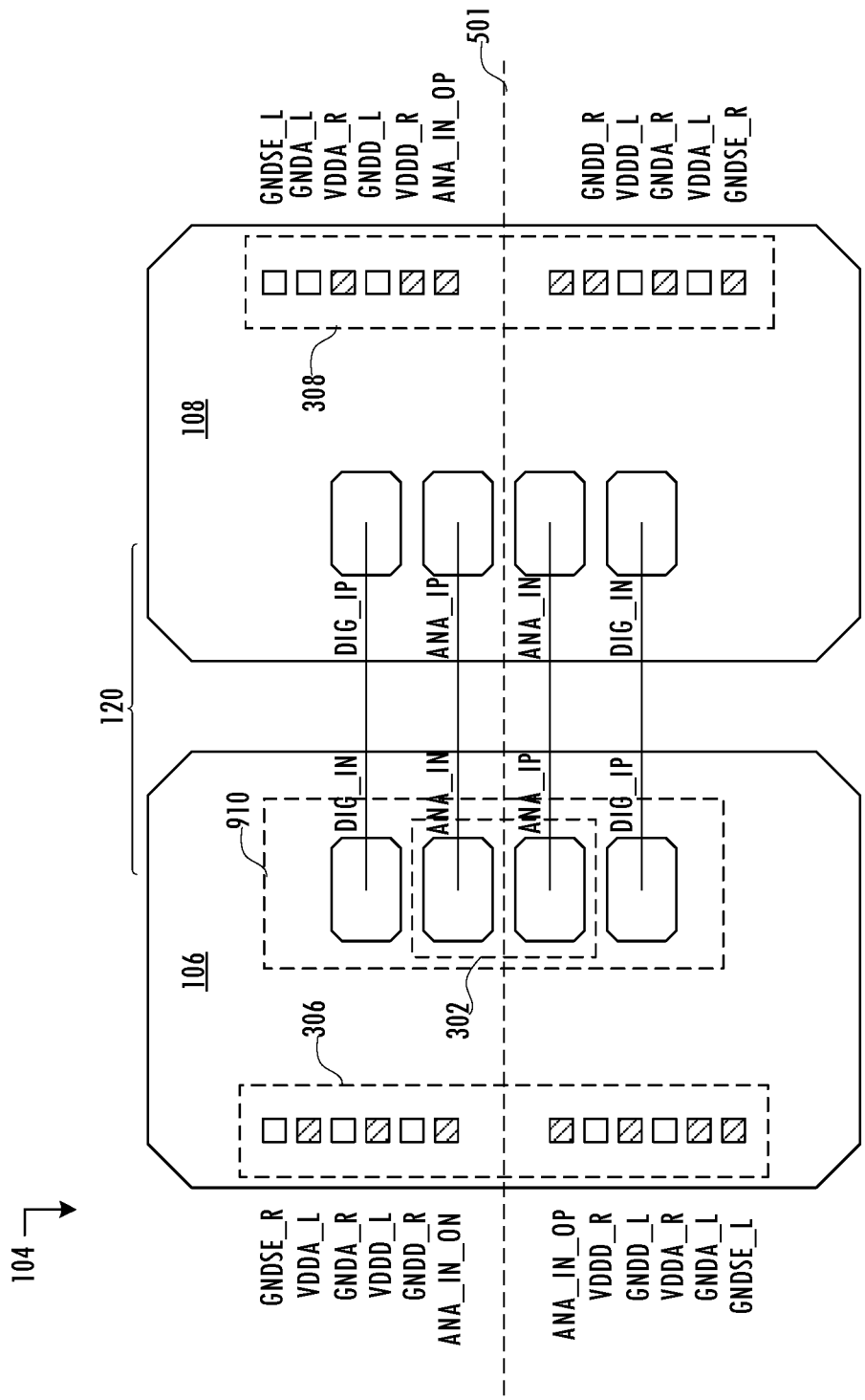
FIG. 11 illustrates a plan view of an exemplary isolator including integrated circuit die with symmetric terminal layout consistent with at least one embodiment of the invention.

Referring to FIG. 7, an alternative symmetric multichannel layout of terminals that is symmetric with respect to line of symmetry 501 between individual terminals of differential pair of terminals 502 arranges other differential pairs of terminals symmetrically with respect to differential pair of terminals 502. The terminal arrangement of FIG. 7 places the inverting terminal adjacent to the corresponding noninverting terminal of each differential pair of terminals to reduce differences in parasitic capacitances as a result of manufacturing process variations. Differential pair of terminals 505 is positioned as a mirror image of differential pair of terminals 507 with respect to line of symmetry 501. Dummy terminal 512 provides terminal 504 with the same parasitic capacitance as terminal 516 provides to terminal 506. Dummy terminal 512 is physically identical to terminal 516 or has dimensions that provide the same parasitic capacitance to terminal 504 as terminal 516 provides to terminal 506. In an exemplary integrated circuit manufacturing process, the terminal arrangement results in the terminals of differential pair of terminals 502 having parasitic capacitances within 10% of each other and may have parasitic capacitances within 1%. Note that dummy terminal 512 and dummy terminal 514 may increase integrated circuit die size and may be cost prohibitive in some applications. Dummy terminal 512 and dummy terminal 514 may be excluded in embodiments where terminal 504 and terminal 506 do not form differential terminals or are signals that can tolerate some reduction in common mode transient immunity.

Referring to FIGS. 8-11, in at least one embodiment of an isolator, other integrated circuit terminals (e.g., terminals 306, which are formed proximate to another edge of integrated circuit die 106) may be arranged symmetrically with respect to line of symmetry 501. In general, terminals 306 and terminals 910 may have the same physical structure (e.g., formed from the same materials and have the same geometry). However, in at least one embodiment, terminals of the isolation communications channel incorporate isolation structures in the terminal, e.g., as described above for a capacitive isolation channel. Accordingly, each terminal of terminals 910 has a physical structure that is identical to each other terminal of terminals 910, but different from the physical structure of each of terminals 306. For example, incorporation of isolation structures into terminal 912, terminal 914, terminal 916, and terminal 918 results in terminals that have greater dimensions than terminals 306 and are formed from different materials than terminals 306. In general, dimensions of terminals 910 are relatively large as compared to the dimensions of other structures on an integrated circuit die due to the need to handle large common mode transient voltage levels.

Terminals 306 are disposed symmetrically with respect to line of symmetry 501, partitioning terminals 306 into set of terminals 902 and set of terminals 904. Set of terminals 902 is a mirror image with respect to line of symmetry 501 of set of terminals 904. Line of symmetry 501 extends through a midpoint between differential pair of terminals 302, which may also be the midpoint of the length of integrated circuit die 106. By positioning differential pair of terminals 302 symmetrically about the midpoint of integrated circuit die 106, in an embodiment of isolator 104, a single integrated circuit design includes the transceiver functionality used in the first voltage domain (e.g., transmitting control signals received from the controller via the isolation communications channel and receiving sensed feedback signals from the load via the isolation communications channel) and the transceiver functionality used in the second voltage domain (e.g., transmitting feedback signals received from a load via the isolation communications channel to the controller and receiving control signals for the load via the isolation communications channel from the controller). In addition, in embodiments of integrated circuit die having a pad-limited layout and terminals formed with the same physical size and materials, positioning a predetermined differential pair of terminals at a location at a midpoint of a side of the integrated circuit die provides a minimum difference in parasitic capacitance between the inverting terminal and the non-inverting terminal of the predetermined differential pair of terminals. Integrated circuit die 106 is configured to operate in the first voltage domain with first functionality and a first set of enabled terminals, as indicated by shading. Integrated circuit die 108 is a replica of integrated circuit die 106 that is configured to operate in a second voltage domain with corresponding functionality and a second set of enabled terminals, as indicated by shading. Enabled terminals are interspersed with non-enabled terminals in a symmetric layout to enable the same integrated circuit die to be used as integrated circuit die 106 or integrated circuit die 108 of isolator 104.

A symmetric terminal layout of the integrated circuit die allows the same integrated circuit die to be configured in a first mode using a first terminal configuration for integrated circuit die 106 and a replica of the integrated circuit die rotated by 180 degrees and configured in a second mode using a second terminal configuration for integrated circuit die 108, to form isolator 104. The symmetric terminal layout of the integrated circuit die provides a compact footprint of the multiple integrated circuits coupled together within a package and reduces or minimizes lengths of associated bond wires. The symmetric terminal layout of the integrated circuit die improves common mode transient immunity of isolator 104 by reducing differences in parasitic capacitance at both end points of the isolation channel. For example, isolator 104 has a common mode transient immunity of at least 100 kV/µs. In other embodiments, integrated circuit die 106 and integrated circuit die 108 are dedicated integrated circuit die including only terminals required for operation in the target application and do not include a selectable bonding configuration.

Thus, techniques for matching the parasitic capacitance of each terminal of a differential pair of terminals increase the tolerance of an isolator product to large common mode transients on ground, without compromising differential signal resolution, have been disclosed. The techniques improve performance of the isolator in response to large common mode transients between different domains. The description of the invention set forth herein is illustrative and is not intended to limit the scope of the invention as set forth in the following claims. For example, while the invention has been described in an embodiment in which capacitive isolation is used, one of skill in the art will appreciate that the teachings herein can be utilized with other isolation channel implementations. Variations and modifications of the embodiments disclosed herein, may be made based on the description set forth herein, without departing from the scope of the invention as set forth in the following claims.

What is claimed is:

1. An integrated circuit isolation product comprising:
   a first integrated circuit die comprising:
      a first terminal;
      a second terminal adjacent to the first terminal, the first terminal and the second terminal being configured as a differential pair of terminals configured to communicate a differential signal across an isolation barrier; and
      at least one additional terminal adjacent to the differential pair of terminals, the at least one additional terminal being disposed symmetrically with respect to the differential pair of terminals.

2. The integrated circuit isolation product, as recited in claim 1, wherein the first terminal has a first parasitic capacitance and the second terminal has a second parasitic capacitance, the first parasitic capacitance being substantially the same as the second parasitic capacitance.

3. The integrated circuit isolation product, as recited in claim 2, wherein the first parasitic capacitance is within 1% of the second parasitic capacitance.

4. The integrated circuit isolation product, as recited in claim 1, wherein the at least one additional terminal is disposed symmetrically with respect to a line of symmetry for the differential pair of terminals, the line of symmetry extending through a midpoint of the first terminal and the second terminal.

5. The integrated circuit isolation product, as recited in claim 4, wherein the at least one additional terminal comprises:
   a third terminal adjacent to the first terminal; and
   a fourth terminal adjacent to the second terminal, the fourth terminal being a physical copy of the third terminal, the second terminal being disposed between the first terminal and the fourth terminal, the first terminal being disposed between the second terminal and the third terminal.

6. The integrated circuit isolation product, as recited in claim 5, wherein the third terminal and the fourth terminal form a second differential pair of terminals configured to communicate a second differential signal across the isolation barrier.

7. The integrated circuit isolation product, as recited in claim 5, wherein the third terminal is a dummy terminal and the fourth terminal is a functional terminal.

8. The integrated circuit isolation product, as recited in claim 5,
   wherein the first terminal, second terminal, third terminal, and fourth terminal are disposed proximate to a first edge of the first integrated circuit die, and
   wherein the first integrated circuit die further comprises a plurality of other terminals disposed proximate to a second edge of the first integrated circuit die, the second edge opposing the first edge,
   wherein the line of symmetry partitions the plurality of other terminals into a first set of terminals and a second set of terminals, the second set of terminals being a mirror image about the line of symmetry of the first set of terminals.

9. The integrated circuit isolation product, as recited in claim 8, wherein the plurality of other terminals comprises:
   a third set of terminals configured to be operable in a first operational mode of the first integrated circuit die; and
   a fourth set of terminals configured to be operable in a second operational mode of the first integrated circuit die.

10. The integrated circuit isolation product, as recited in claim 5, wherein the at least one additional terminal further comprises:
    a fifth terminal and a sixth terminal forming a second differential pair of terminals, the fifth terminal disposed adjacent to the third terminal and the sixth terminal disposed adjacent to the fourth terminal.

11. The integrated circuit isolation product, as recited in claim 1, further comprising:
    an integrated circuit package comprising:
       the first integrated circuit die having a first operational mode and a second operational mode, the first integrated circuit die being configured in the first operational mode and to use a first voltage domain, and the first integrated circuit die being disposed with a first orientation; and
       a second integrated circuit die that is a replica of the first integrated circuit die and configured in the second operational mode and to use a second voltage domain, the first voltage domain being electrically isolated from the second voltage domain, and the second integrated circuit die being disposed with a second orientation,
       wherein the second orientation is rotated 180 degrees from the first orientation, and
       wherein a corresponding first terminal of the second integrated circuit die is coupled to the second terminal of the first integrated circuit die and a corresponding second terminal of the second integrated circuit die is coupled to the first terminal of the first integrated circuit die.

12. The integrated circuit isolation product, as recited in claim 11, wherein a line of symmetry extends through a midpoint of the first terminal of the first integrated circuit die and the second terminal of the first integrated circuit die and the line of symmetry extends through a corresponding midpoint of the corresponding first terminal of the second integrated circuit die and the corresponding second terminal of the second integrated circuit die.

13. A method of manufacturing an integrated circuit product comprising:
    forming a first terminal of an integrated circuit die;
    forming a second terminal adjacent to the first terminal of the integrated circuit die, the first terminal and the second terminal being configured as a differential pair of terminals configured to communicate a differential signal across an isolation barrier; and
    forming at least one additional terminal adjacent to the differential pair of terminals, the at least one additional terminal being disposed symmetrically with respect to the differential pair of terminals.

14. The method, as recited in claim 13, wherein the first terminal has a first parasitic capacitance and the second terminal has a second parasitic capacitance, the first parasitic capacitance being substantially the same as the second parasitic capacitance.

15. The method, as recited in claim 14, wherein the first parasitic capacitance is within 1% of the second parasitic capacitance.

16. The method, as recited in claim 13, wherein the at least one additional terminal is disposed symmetrically with respect to a line of symmetry for the differential pair of terminals, the line of symmetry extending through a midpoint of the first terminal and the second terminal.

17. The method, as recited in claim 16,
wherein the first terminal, the second terminal, and the at least one additional terminal are disposed proximate to a first edge of the integrated circuit die, and the method further comprises:
forming a plurality of other terminals disposed proximate to a second edge of the integrated circuit die, the second edge opposing the first edge,
wherein the line of symmetry partitions the plurality of other terminals into a first set of terminals and a second set of terminals, the second set of terminals being a mirror image about the line of symmetry of the first set of terminals.

18. The method, as recited in claim 16,
wherein the at least one additional terminal comprises a third terminal and a fourth terminal,
wherein the third terminal and the fourth terminal are configured to form a second differential pair of terminals configured to communicate a second differential signal across the isolation barrier or the third terminal is a dummy terminal and the fourth terminal is a functional terminal configured to communicate a signal across the isolation barrier.

19. An isolator comprising:
a first die coupled to a first voltage domain, the first die comprising:
a first terminal;
a second terminal adjacent to the first terminal, the first terminal and the second terminal forming a differential pair of terminals configured to communicate a differential signal across an isolation barrier; and
a third terminal adjacent to the first terminal; and
a fourth terminal adjacent to the second terminal, the second terminal being disposed between the first terminal and the fourth terminal, the first terminal being disposed between the second terminal and the third terminal,
wherein the fourth terminal is a physical copy of the third terminal and a first parasitic capacitance of the first terminal is substantially the same as a second parasitic capacitance of the second terminal; and
a second die coupled to a second voltage domain, the second die being electrically isolated from and communicatively coupled to the first die, the second die comprising:
a fifth terminal;
a sixth terminal adjacent to the fifth terminal, the fifth terminal and the sixth terminal forming a second differential pair of terminals configured to communicate the differential signal across the isolation barrier; and
a seventh terminal adjacent to the fifth terminal; and
an eighth terminal adjacent to the sixth terminal, the sixth terminal being disposed between the fifth terminal and the eighth terminal, the fifth terminal being disposed between the sixth terminal and the seventh terminal,
wherein the eighth terminal is a second physical copy of the seventh terminal and a third parasitic capacitance of the fifth terminal is substantially the same as a fourth parasitic capacitance of the sixth terminal.

20. The isolator, as recited in claim 19,
wherein a line of symmetry extends through a midpoint of the first terminal and the second terminal and through a second midpoint of the fifth terminal and the sixth terminal, and
wherein the first die comprises a plurality of additional terminals, the line of symmetry partitioning the plurality of additional terminals into a first set of terminals and a second set of terminals, the second set of terminals being a mirror image about the line of symmetry of the first set of terminals.

* * * * *